(12) United States Patent
Rolandi

(10) Patent No.: US 7,885,123 B2
(45) Date of Patent: Feb. 8, 2011

(54) INTEGRATED CIRCUIT FOR MEMORY CARD AND MEMORY CARD USING THE CIRCUIT

(75) Inventor: Paolo Rolandi, Voghera-Pavia (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 2808 days.

(21) Appl. No.: 09/881,581

(22) Filed: Jun. 14, 2001

(65) Prior Publication Data

US 2002/0021596 A1 Feb. 21, 2002

(30) Foreign Application Priority Data

Jun. 22, 2000 (EP) .................................. 00830438

(51) Int. Cl.
| | |
|---|---|
| G11C 16/04 | (2006.01) |
| G11C 7/10 | (2006.01) |
| G11C 16/06 | (2006.01) |
| G11C 16/18 | (2006.01) |
| G11C 8/12 | (2006.01) |

(52) U.S. Cl. ............................ 365/185.32; 365/185.29; 365/219; 365/189.02; 365/230.02; 365/230.03; 711/103

(58) Field of Classification Search ............ 365/185.01, 365/185.29, 185.32, 140, 220, 221, 218, 365/53; 257/428, 431, 435; 711/103, 189.02, 711/219, 230.02, 230.03

See application file for complete search history.

(56) References Cited

U.S. PATENT DOCUMENTS

| | | | | | |
|---|---|---|---|---|---|
| 4,810,865 | A | * | 3/1989 | Gloton et al. | ............ 235/487 |
| 5,255,236 | A | * | 10/1993 | Maehara | ............ 365/218 |
| 5,257,221 | A | | 10/1993 | Leak et al. | ............ 365/53 |
| 5,365,466 | A | * | 11/1994 | Hazard | ............ 708/250 |
| 5,455,785 | A | * | 10/1995 | Nazari | ............ 365/53 |
| 5,473,758 | A | | 12/1995 | Allen et al. | ............ 395/430 |
| 5,567,177 | A | * | 10/1996 | Foerstel et al. | ............ 439/526 |
| 5,663,901 | A | * | 9/1997 | Wallace et al. | ............ 365/52 |
| 5,867,428 | A | * | 2/1999 | Ishii et al. | ............ 365/185.24 |
| 6,341,100 | B1 | * | 1/2002 | Fujioka | ............ 365/233.1 |
| 6,516,400 | B1 | * | 2/2003 | Suzuki | ............ 711/209 |
| 6,892,269 | B2 | * | 5/2005 | Polizzi et al. | ............ 711/103 |
| 6,968,472 | B2 | * | 11/2005 | Fernald | ............ 713/400 |

\* cited by examiner

*Primary Examiner*—J. H. Hur
(74) *Attorney, Agent, or Firm*—Lisa K. Jorgenson; Allen, Dyer, Doppelt, Milbrath & Gilchrist, P.A.

(57) ABSTRACT

An integrated circuit for storing data, and for application in a memory card that operates in cooperation with at least one of an external acquisition system and an external processing system includes input/output terminals for receiving the data to be stored, and an electrically programmable non-volatile memory for storing the data in digital format. The memory includes a first terminal for receiving a programming signal for enabling storage of the data, and a second terminal for receiving a reading signal for enabling output of the stored data via the input/output terminals. A memory control circuit is connected to the first and second terminals of the electrically programmable non-volatile memory, and to the input/output terminals for generating programming and reading signals based upon the command signal. The electrically programmable non-volatile memory is erasable by electromagnetic radiation for permitting a non-electrical erasure of the stored data.

18 Claims, 7 Drawing Sheets

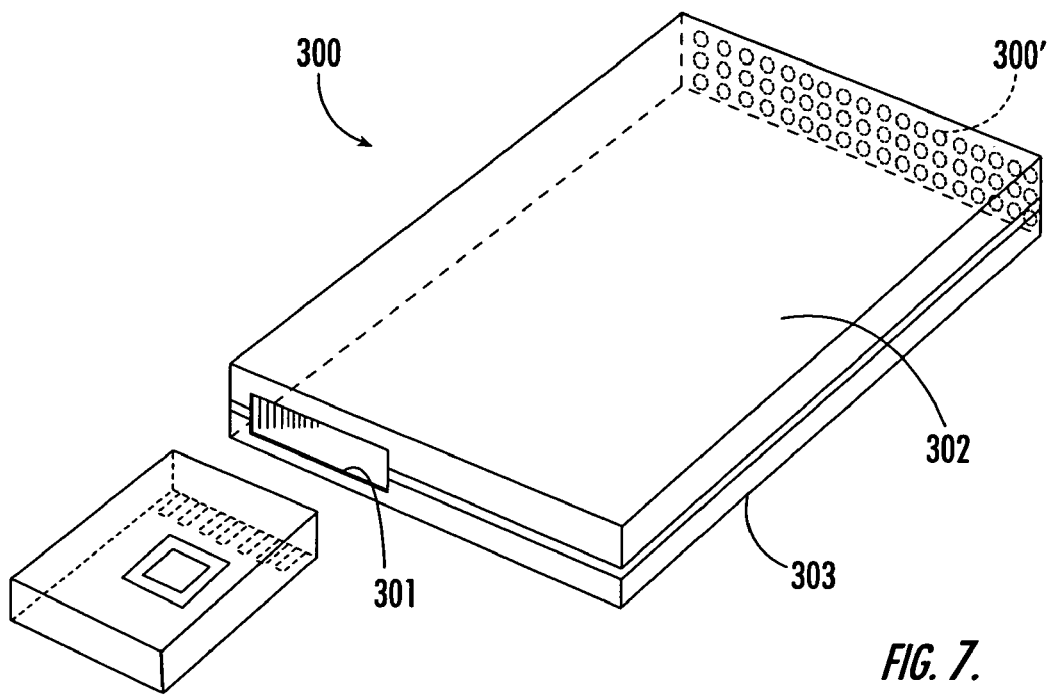
FIG. 7.
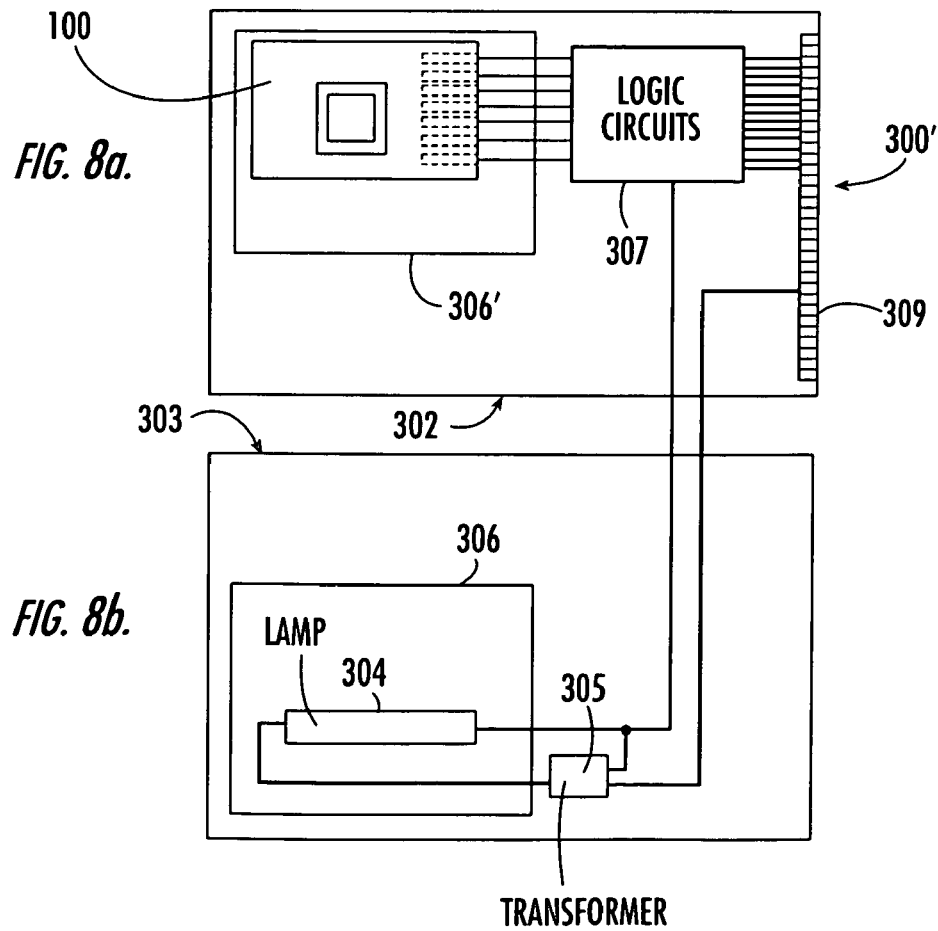
FIG. 8a.
FIG. 8b.

INTEGRATED CIRCUIT FOR MEMORY CARD AND MEMORY CARD USING THE CIRCUIT

FIELD OF THE INVENTION

The present invention relates to the field of memory devices, and more particularly, to an integrated circuit that is capable of being used in a memory card for storing data in digital format. More particularly, the present invention relates to a memory card of the multimedia type, i.e., capable of storing sounds and/or images (referred to hereafter as sounds/images) in digital format.

BACKGROUND OF THE INVENTION

Memory cards, which can be used for non-volatile storage, may be applied to the acquisition and processing of sounds/images in digital format (Digital Audio/Video). The use of these cards is of great interest in that they form easily transportable media of limited overall dimensions and with considerable storage capacity. A further significant advantage of memory cards over other storage media, such as magnetic tapes, is that they do not require mechanical parts that move, which are subject to wear and rapid consumption.

These memory cards can be inserted directly into a system for acquiring sounds/images in digital format, such as a DSC (Digital Still Camera), a video camera with DSC functionality, or an audio recorder for music and speech which transfers the sounds/images, after they have been acquired and digitized, to the memory card.

In general, with respect to sounds/images in digital format, the data stored in the memory card is subsequently transferred by a host processor apparatus, such as an ordinary personal computer, to media having a higher capacity, for example, a hard disk of the personal computer. In the host processor apparatus, the data can be processed by programs which require a computing power and a storage capacity which cannot be provided in the acquisition apparatus mentioned above. In such cases, memory cards are used for the temporary storage of the acquired data.

To make the memory card usable for the subsequent storage of new data, it has to be subjected to an operation of erasing the data previously stored on it. Typically, this erasure does not take place in the acquisition system itself, but is carried out in the host processor apparatus used for transferring the data from the card to the larger-capacity memory (off-line erasure). A memory card of the type currently used for sounds/images in digital format comprises an outer casing incorporating an integrated circuit made from semiconductor material comprising one or more semiconductor memories, suitable for non-volatile data storage.

The memory cards currently in use conform to physical specifications set by international standards or by standards established by the manufacturers themselves, which make them compatible with personal computers. One of these standards has been established by the PCMCIA (Personal Computer Memory Card International Association).

The integrated circuits used in conventional memory cards use non-volatile semiconductor memories which are electrically erasable and programmable, such as the EEPROM type (Electrically Erasable Programmable Read Only Memory), or, preferably, the Flash EEPPROM type. Recently, memory cards using read-only non-volatile semiconductor memories (ROM) have also become available, with the data written permanently onto them during the manufacture of the integrated circuit (Mask ROM). Memory cards of the latter type are used, for example, as storage media for music, in the same way as music CDs.

The erasure of the data stored in electrically erasable and programmable memories, and, in particular, in Flash memories with internal architecture of the type known as NOR, requires, as is known, an appropriate pre-programming operation that includes a preliminary programming of all the memory cells in such a way as to bring them to the same logic level in order to prevent any of the memory cells from entering a state of depletion during the erasure.

After this pre-programming, the electrical erasure of the stored data can take place. The control of the operations of erasing and programming Flash memories requires the presence of a microprocessor provided with a corresponding microprogram which may be of considerable complexity. Flash memories with architecture of the type known as NAND do not require pre-programming of the memory cells to be subjected to erasure. However, memories with this second type of architecture have certain drawbacks with respect to the former type, especially with respect to the speed of reading the stored data.

An example of a memory card including Flash memories is described in U.S. Pat. No. 5,663,901. In this patent, with reference to FIG. 13A, a description is given of a memory card using a plurality of memories of the Flash EEPROM type. These memories are associated with a controller module provided with a microprocessor for controlling the exchange of data between the EEPROM memories and the external apparatus, which act as hosts for the memory card via interface storage registers. The controller module also comprises a controller for the memories, which is provided, in turn, with a timing signal generator.

It should be noted that the necessity of using microprocessors for the implementation of particular memory control procedures, as well as the intrinsic complexity of Flash memories, make the production cost of memory cards particularly high. Furthermore, the use of complex controllers makes it very difficult to integrate the controllers on a single semiconductor chip, particularly on the chip used for the Flash memories, and requires the formation of electrical interconnections for the transfer of the data between the various chips, thus further increasing the costs of design and production.

This is reflected in the final cost of the systems for acquiring and processing sounds/images which make use of memory cards, thus limiting their distribution essentially to professional use.

It should also be noted that the electrical erasure and programming functionality offered by Flash memories according to the procedures dictated by the technological characteristics of the memory does not appear to be imposed by requirements emerging from their application to the field of the acquisition of sounds/images in digital format. In this field of application, complete erasure of the memory before a subsequent use is required in all cases.

SUMMARY OF THE INVENTION

In view of the foregoing background, an object of the present invention is to provide an integrated circuit made from semiconductor material which is capable of being used in memory cards for the non-volatile storage of data in digital format, particularly, but not exclusively, for application in systems for acquiring and processing sounds/images, which permits a reduction of the production costs of the memory cards with respect to the memory cards of the known type, while maintaining compatibility with the conventional systems for acquiring data in digital format.

This and other objects, features and advantages are provided by an integrated circuit made from semiconductor material capable of storing data in digital format, particularly for application in a memory card which can be associated for operation with an external acquisition system and an external processing system.

The integrated circuit comprises input/output means for receiving the data from the external acquisition system or from the external processing system, for sending the data to the external processing apparatus and for receiving a digital circuit-command signal from the system and from the apparatus. An electrically programmable non-volatile memory stores the digital data, and comprises a first terminal for an electrical programming signal capable of enabling the storage of the data available in the input/output means and a second terminal for an electrical read signal capable of enabling the output of the data from the memory to make them available in the input/output means.

The integrated circuit further comprises memory control means connected to the first and second terminals and to the input/output means for generating the electrical signals for programming and reading the memory from the command signal. The memory is of the type which can be erased by exposure to electromagnetic radiation, particularly ultraviolet radiation, to permit the non-electrical erasure of the stored data.

Also according to the present invention, a memory card is provided for storing data in digital format, with the card being associated for operation with an external acquisition system for receiving and storing data, and with an external processing apparatus for making the stored data available to the processing apparatus.

The memory card comprises an outer casing incorporating an integrated circuit made from semiconductor material capable of storing the data, and a non-volatile electrically programmable memory integrated in the circuit. The memory is of the type that can be erased by exposure to an external source of electromagnetic radiation of suitable wavelength, particularly ultraviolet radiation, and in that the casing is provided, at the position of the memory, with means transparent to the electromagnetic radiation.

BRIEF DESCRIPTION OF THE DRAWINGS

The invention will be more clearly understood from the description of embodiments thereof provided by way of example and without restrictive intent, given with reference to the attached figures, of which:

FIG. 7 schematically shows a first type of adapter, conforming to the PCMCIA standard, for interfacing the memory card according to the present invention with a host processing system;

FIGS. 8a and 8b schematically show the structure of the adapter illustrated in FIG. 7;

DETAILED DESCRIPTION OF THE PREFERRED EMBODIMENTS

Figure 1:
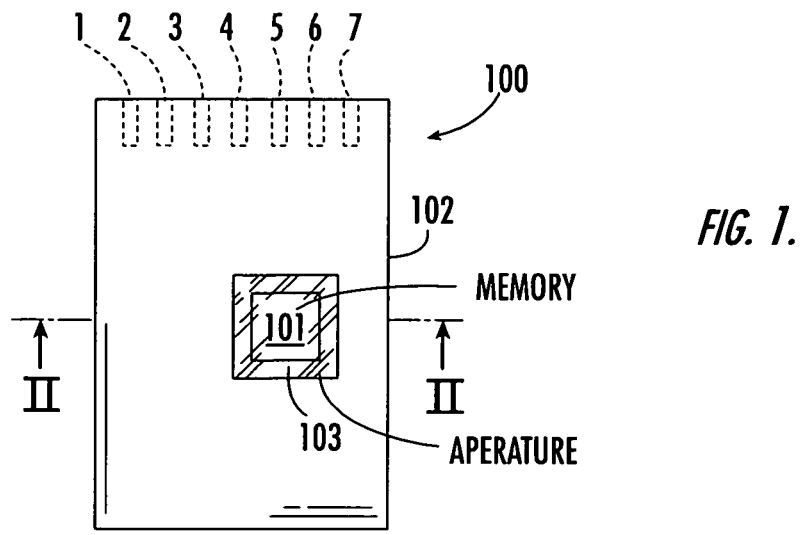
FIG. 1 is a top view of a memory card according to the present invention.
Figure 2:
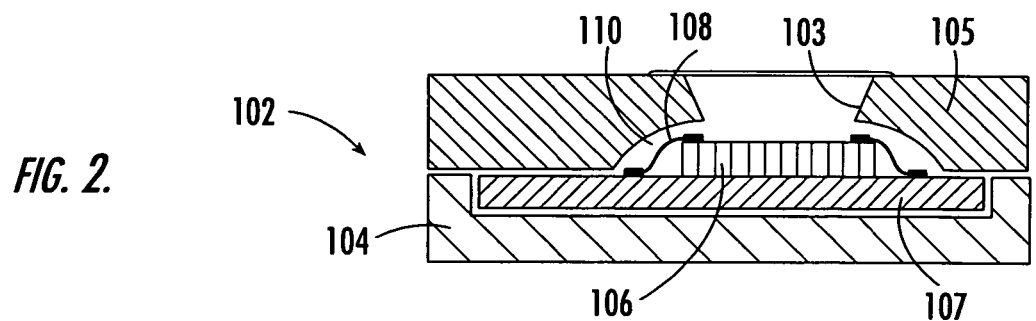
FIG. 2 is a cross-sectional view through the plane II-II of the memory card illustrated in FIG. 1.
Figure 3:
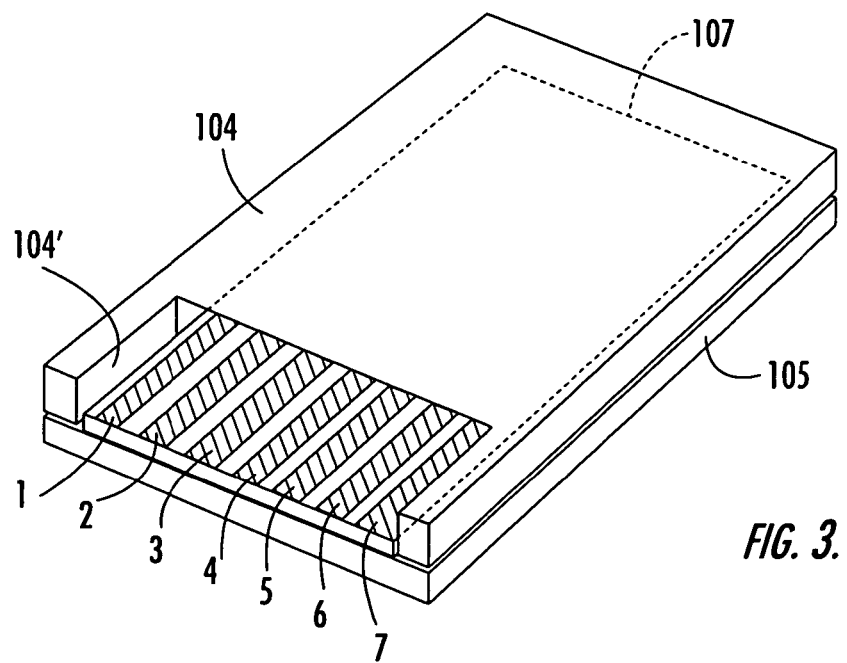
FIG. 3 is a bottom perspective view of the memory card illustrated in FIG. 1.

With reference to the drawings, and in particular to FIGS. 1, 2 and 3, these drawings show schematically, a top plan view in FIG. 1, a cross section view in FIG. 2, and a bottom perspective view in FIG. 3 of a memory card 100 for multimedia applications according to the present invention. The memory card 100 comprises a containment casing 102, made from a plastic material of the type commonly used for memory cards, i.e., pre-molded plastic, thermosetting for injection molding.

The dimensions of the casing preferably conforms to one of the existing standards for memory cards, for example the MMC (MultiMedia Card) standard, thus making the memory card compatible with the equipment already available on the market. The casing 102 contains a semiconductor chip in which is formed an integrated circuit comprising a memory 101 of the non-volatile electrically programmable type, for example, an EPROM (Erasable Programmable Read Only Memory).

An aperture 103 formed in the casing 102 at the position of the EPROM memory 101 allows an electromagnetic radiation of appropriate wavelength, for example ultraviolet radiation preferably having a wavelength of approximately 250 nm, generated externally, to strike the EPROM memory 101 located inside the casing.

The memory card 100 also comprises electrical macroterminals or pins which enable the memory card to be connected electrically to an external host system that is capable of receiving the memory card 100 and with which the card is to be interfaced. The number of pins of the memory card depends on the standard to which the memory card conforms. For example, in the MMC standard the memory card has seven pins 1-7, arranged in such a way as to be accessible from external the casing, preferably on the side of the casing opposite the aperture 103.

The following description will refer, for simplicity, to a memory card conforming to the MMC standard. In this standard, pin 1 (RSV) is a terminal which is not connected in existing memory cards, but has been provided for applications which may be necessary in the future. Pin 2 (CMD) is a terminal for a bidirectional command/response signal, i.e., the CMD signal which is suitably encoded. This signal can be generated by an external system such as a system for acquiring and digitizing sounds/images, or a host processing system for discharging and/or processing is data, and carries the instructions for formatting the memory card and the instructions for programming or for reading data to/from the memory 101. Moreover, the CMD signal can be generated by the memory card and carries data relating to the current state of the memory card.

Pin 3 (VSS1) is a first ground terminal. Pin 4 (VDD) is a terminal through which a supply voltage Vcc is supplied to the memory card. Pin 5 (CLK) is a terminal for supplying a timing or clock signal, CLK, to the memory card. Pin 6 (VSS2) is a second ground terminal. Two separate ground terminals (VSS1 and VSS2) are provided to increase the immunity to switching noise of the integrated circuits incorporated in the memory card. Pin 7 (DAT) is a terminal of the memory card which can be connected to a bidirectional input and output line, I/O, on which the data to be stored or already stored in the memory card 100, and the addresses of the memory locations in which the data are to be stored or are already stored, can travel in a serial mode.

With reference to FIG. 2, the casing 102 comprises a container 104 and a cover 105 in which the aperture 103 is formed in a suitable position. Inside the container 104 is a printed circuit board (PCB) 107 to which the integrated-circuit semiconductor chip 106 is applied. The chip 106 is provided with contact pads (not shown in FIG. 2) for the connection of electrical conducting wires 108 (bonding wires) to the PCB 107. The EPROM memory 101 is integrated in the integrated-circuit chip 106.

On the PCB 107, tracks of conductive material are formed. These are connected to the bonding wires 108, and extend to the pins 2-7 (as stated above, pin 1 is not connected in existing memory cards according to the MMC standard), which are accessible from external the memory card 100, in such a way that the pins 2-7 are brought into electrical contact with corresponding contact pads on the chip 106, which act as microterminals of the integrated circuit 106.

The pins 1-7 are tracks of conductive material of suitable dimensions provided on the PCB 107. As shown in FIG. 3, the container 104 has, on its underside, a gap 104' through which the terminals 1-7 of the PCB 107 are accessible. The cover 105 is shaped in such a way as to form, when fitted on the container 104, a cavity 110 in which the integrated circuit 106 is housed. The aperture 103 formed in the cover 105 communicates with the cavity 110.

The aperture 103 and the cavity 110 are provided with protective means which are capable of mechanically protecting the integrated-circuit chip 106 located on the PCB 107 beneath them, providing thermal insulation, preventing infiltration of water, and at the same time allowing the passage of ultraviolet radiation capable of erasing the EPROM memory 101. For example, the cavity 110 can be filled with polyaniline.

The memory card 100 is preferably provided with reversible closing means to enable the aperture 103 to be closed and reopened for the passage of the ultraviolet radiation. Preferably, an adhesive element (not shown), capable of preventing the passage of light whose ultraviolet components might cause undesired erasures of the EPROM memory, is applied to the memory card 100 at the position of the aperture 103. This adhesive element is such that it can be removed to allow the erasure of the memory through the aperture 103.

Figure 4:
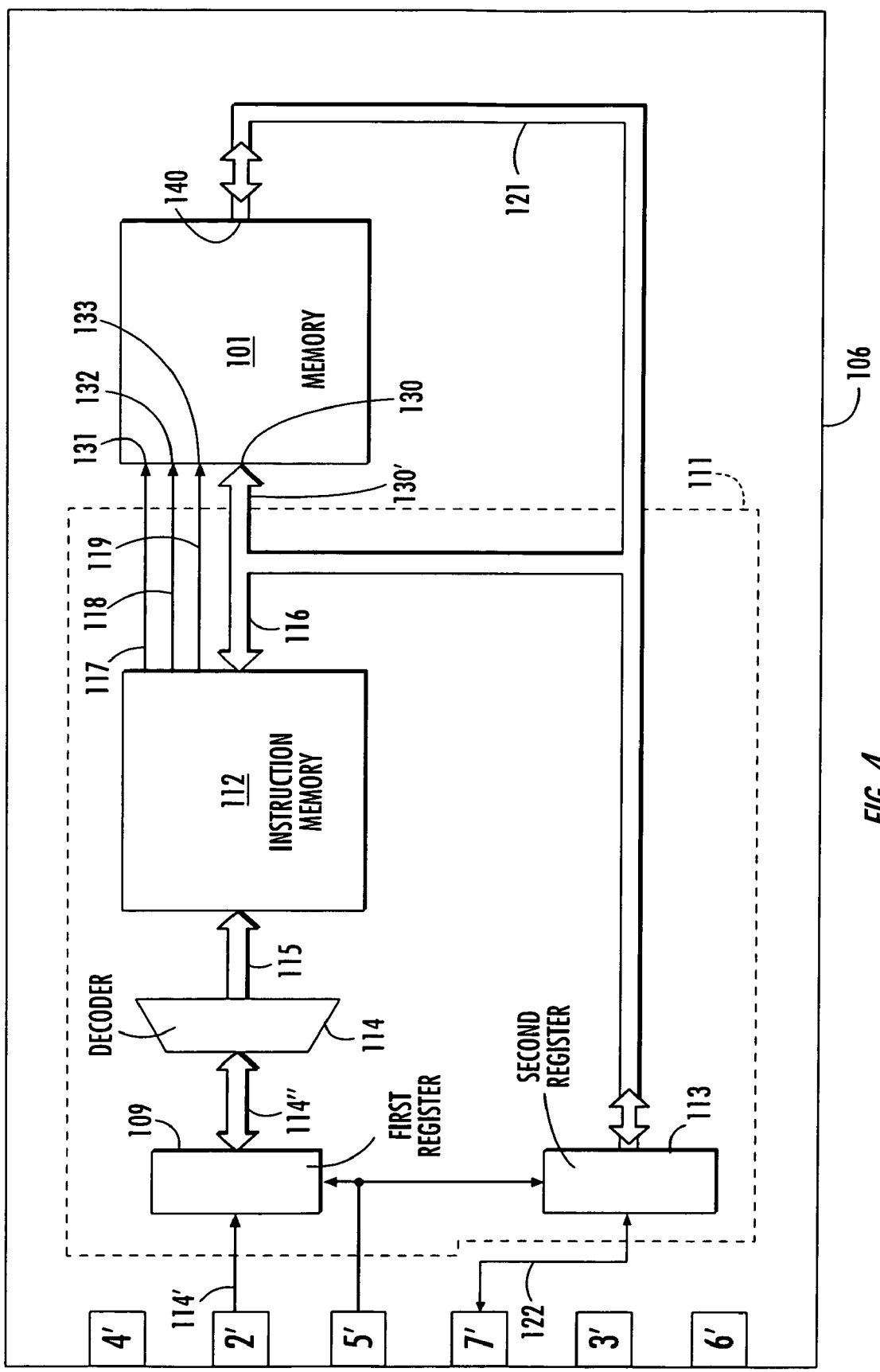
FIG. 4 is a block diagram of an integrated circuit incorporated in the memory card according to the present invention.

FIG. 4 shows, in the form of a simplified block diagram, an integrated-circuit chip 106 made from semiconductor material on which is integrated a circuit capable of storing data in digital format. The integrated-circuit chip 106 comprises the EPROM memory 101 and a control device 111 including a first register 109, a decoder 114, an instruction memory 112 and a second register 113.

Additionally, the chip 106 is provided with microterminals (contact pads) 2'-7' which can be connected electrically to the corresponding macroterminals (pins) 2-7 of the memory card. The memory 101 is a non-volatile electrically programmable memory which can be erased by exposure to electromagnetic radiation having a suitable wavelength. This memory comprises a plurality of memory locations which are selectively addressable for the reading and storing of data. Ultraviolet rays, preferably having a wavelength of approximately 250 nm, can be used to erase the memory 101.

In particular, the memory 101 is a conventional memory of the EPROM type with memory cells comprising floating gate transistors. As is known, a floating gate transistor is a MOS transistor provided with a floating gate electrode immersed in a dielectric material, and therefore electrically insulated, on which it is possible to store an electrical charge which remains trapped in a potential barrier even in the absence of a programming voltage.

The memory 101 can have an architecture of the NOR or the NAND type, and can be either two-level or multi-level. The memory 101 preferably has a capacity of at least 4 MB. Additionally, for applications such as a storage medium for sounds/images, the memory 101 must be characterized by sufficiently short write times.

The memory 101 comprises a plurality of terminals 130 for the input of address signals, each of which is capable of selecting a memory location, a terminal 131 for a signal OE (Output Enable) for enabling the outputs of the memory 101 (read enabling), a terminal 132 for a signal CE (Chip Enable) for enabling the memory 101, and a terminal 133 for a signal PGM (Program) for enabling the programming of the memory 101. Additionally, the memory 101 comprises a plurality of terminals 140 for the input/output of data in digital format.

The instruction memory 112 is capable of storing the instructions relating to the control of the memory 101, particularly those relating to programming and reading. The instruction memory 112 therefore implements, by a set of microinstructions, i.e., firmware stored therein, the protocol (commands, enabling signals, etc.) of the specific standard to which the memory card conforms. To make the production process particularly advantageous, the instruction memory 112 has a physical structure similar to that of the memory 101, being, for example, of the EPROM type like the memory 101.

The first register 109 is connected by a transfer line 114' to the microterminal 2' of the chip 106, which will consequently be electrically connected to the corresponding pin 2 of the memory card to receive the encoded command/response signal CMD in serial form arriving from (or sent to) an external system for acquiring and digitizing sounds/images, or from an external apparatus for processing these data. Additionally, the first register 109 is connected to the microterminal 5', which in turn will be connected to pin 4 of the memory card, to receive the timing signal CLK.

The first register 109, of the shift type, can be used to carry out a serial/parallel conversion (or vice versa) from the line 114' to a bus 114". The first register 109 is timed by the timing signal CLK which is supplied to the memory card by the external system (i.e., system for acquiring sounds/images or host processor) in which it is inserted. The decoder 114 is capable of decoding the signal CMD arriving from the register 109, making available on output lines 115 address signals for the instruction memory 112, capable of selecting the locations of the instruction memory 112 and consequently the microinstructions stored in it.

By means of these addresses, the instruction memory 112 can be used to make available, on its output lines 117, 118, 119 respectively, the signal OE, the signal CE, and the signal PGM for controlling the memory 101 according to the command received. The terminals 140 of the memory 101 are connected to data input/output lines forming a bus 121. The data leaving the memory 101 or the data to be stored in the memory 101 can be transferred along these data input/output lines.

The second register 113, of the shift type, is connected by a single line 122, capable of serially transferring the addresses for the memory 101 and the data for input/output to/from the memory 101 to the microterminal 7', which in turn will be connected to pin 7 of the memory card. Additionally, the register 113 is connected to the bus 121 of the data input/output lines of the memory 101, and also to an address-line bus 130', connected to the terminals 130 of the memory 101. The second register 113 can be used to carry out a serial/parallel conversion (and vice versa) from the line 122 to the bus 121 for the data in digital format in transit. The register 113 is timed by an external timing signal CLK, supplied through pin 5 of the memory card to the microterminal 5', to which the register 113 is connected. The lines 122 and 114' are a particular example of possible input/output means capable of receiving/sending the data in digital format and capable of receiving/sending command signals of the integrated circuit on the chip 106.

The control device 111 can be made with means of controlling the memory 101 which are different from those described, but in any case are capable of generating, from the command signals supplied on the microterminal 2', the aforementioned signals for enabling the memory, for enabling programming, and for enabling the reading of the memory.

The microterminals 3' and 6' can be connected to ground and the microterminal 4' is suitable for receiving the supply voltage $V_{cc}$. For clarity of representation, FIG. 4 does not show the electrical connections between the pads 4', 3' and 6' and the registers 109 and 113, the decoder 114, the instruction memory 112 and the EPROM memory 101, since these connections will be obvious to a person skilled in the art.

FIG. 4 also shows an optional bus 116 which, as described in detail below, is used for programming the instruction memory 112. In other words, the bus is used for storing the appropriate firmware for making the memory card functionally compatible with the predetermined standard. The instruction memory 112 is programmed by sending the data, corresponding to the microinstructions, to be stored in the memory 112, through pin 7 connected to the microterminal 7', while the addresses of the locations in the memory 112 in which the microinstructions are to be stored are supplied through pin 2, which is connected to the microterminal 2'.

If the instruction memory 112 is also a memory which can be erased by electromagnetic radiation of suitable wavelength, typically ultraviolet radiation, and in particular if it is an EPROM memory, the integrated circuit on the semiconductor chip 106 is provided with a metallic layer on part of its surface. This metallic layer, which can be produced, for example, by a suitable degree of metallization specified in the manufacturing process stream, is capable of covering the region of the chip corresponding to the instruction memory 112 and serves to reflect the electromagnetic radiation emitted by an external source and used for erasing the memory 101.

Thus the memory 112 is not struck by the radiation and the instructions stored in it are not erased. In place of the metallic layer, or in addition to this layer, it is possible to use other means of protecting the memory 112. For example, the aperture 103 in the memory card can be formed only at a position in the region of the integrated circuit comprising the memory 101, and the containment casing 102 can be non-transparent to the radiation for erasing the memory 112.

The different components shown schematically in FIG. 4 and the electrical connections between them can be produced by conventional integration techniques. Preferably, the control device 111 and the memory 101 are formed on a single chip of semiconductor material, but they can also be formed on a plurality of separate chips connected electrically by suitable metallic tracks formed on a printed circuit board (PCB) on which these chips are mounted.

The memory card described up to this point is of the type called Chip On Board (COB), since the integrated circuit or circuits are directly mounted on one or more printed circuit boards (PCBs). In an alternative version of the memory card 100, the chip 106 in which is formed the integrated circuit for storing the data in digital format can be incorporated in a corresponding container (package), which is then mounted on a printed circuit board by conventional techniques, such as surface mounting.

The operation of programming the memory card 100 comprising the chip 106, in other words the writing of the data to the memory 101, takes place in the following way. The addresses and the data in digital format, supplied through pin 7 of the memory card to the microterminal 7', are transferred in serial mode, and in synchronization with the signal CLK, through the line 122, to the second register 113.

The second register 113, in synchronization with the signal CLK, loads these addresses and data. When the register 113 has been loaded with an address to be supplied to the memory 101 to identify a location of the memory, and with a byte or a word of data, the register makes its content available on the buses 130' and 121 respectively.

The command signal CMD supplied in serial mode to the microterminal 2' is loaded, in synchronization with the timing signal CLK, into the first register 109. The first register 109 then makes the data byte or word loaded in it available on the bus 114".

The command signal carrying a write instruction is decoded by the decoder 114 which supplies, on the output lines 115, the addresses of the instructions, corresponding to the write operation, stored in the instruction memory 112. The memory 112 makes the enabling signal CE available on the line 118 by activating it. The enabling signal CE can be used to enable the memory 101. On the other hand, the signal OE on the line 117 is kept inactive, enabling, at the input of data, the input circuits of the memory connected to the lines of the bus 121.

The memory 112 supplies, to the memory 101, the signal PGM, which commands the programming of the memory, through the line 119. The necessary voltage for programming the memory cells is generated within the chip 106, and in particular within the memory 101, by suitable charge pumps which are capable of supplying a higher voltage from the supply voltage Vcc. This enables the data present on the bus 121 to be stored in the memory 101, in the location whose address is present on the lines of the bus 130'.

The reading operation is carried out by sending, in serial mode, a signal carrying a code for reading (READ) to the microterminal 2'. After a serial/parallel conversion is carried out by the first register 109, this code is decoded by the decoder 114, which will have at its output the addresses of the locations of the instruction memory 112 in which the instructions corresponding to the reading operation are stored.

The instruction memory 112 supplies the memory-enabling signal CE to the memory 101 through the line 118, and supplies the output-enabling signal OE through the line 119. The address of the memory location 101 whose content is to be read is supplied, again in serial mode, through the microterminal 7'. The register 113, timed by the timing signal CLK supplied through the microterminal 5', carries out a serial/parallel conversion and, through the bus 130', supplies to the memory 101 the address of the memory location which is to be read.

The enabling of the outputs of the memory 101 causes the data read at the addressed locations to be transferred in parallel mode via the bus 121 to the second register 113. After it has been loaded, the second register 113, timed by the timing signal, transfers the stored data to the line 122 in serial mode, to make them available at the output of the microterminal 7'.

The stored data are erased by subjecting the memory 101 to ultraviolet radiation. As is known, the ultraviolet radiation supplies the electrons trapped in the floating gates of the memory cells with the energy necessary to overcome the potential barrier which was trapping them. This removal of the charges from the floating gates corresponds to the erasure of the stored information from the memory cells. For the instruction memory 112, the erasure is prevented by the presence of the protective metallic layer.

It should be noted that the non-electrical erasure of the memory 101, although carried out simply by exposure to electromagnetic radiation, makes the production of the control devices 111 considerably less complicated and less costly than the production of controllers that include true microprocessors, as used in conventional memory cards, which have to control complex algorithms for the electrical erasure of Flash memories.

Following exposure to the ultraviolet radiation, all the data stored in the memory 101 are erased, and the memory card 100 can be used for storing new data. It should be noted that the memory card 100 can have different dimensions, different external shapes or a different number of pins from those shown by way of example, according to the standard to which it relates.

The modifications to be made to the memory card 100 to match it to a specific standard will be evident to a person skilled in the art from the present description and the figures. In particular, the memory card 100 can be adapted to various existing standards while using the same integrated circuit.

The presence of the bus 116 enables the instructions, to be stored in the instruction memory 112, to be entered through the bus 116 after the integrated-circuit chip 106 has been produced. The use of an EPROM memory as the instruction memory 112 offers the memory card manufacturer a high degree of flexibility, by releasing him from the restrictions of the specific standard with which conformity is desired.

The choice of the standard to which the memory card is to conform can be made at the time of manufacture, without the need for modifications to the integrated structure, simply by storing, by electrical programming of the memory 112, the appropriate microprogram, by a process which does not in any way involve the physical structure of the integrated circuit.

Figure 5:
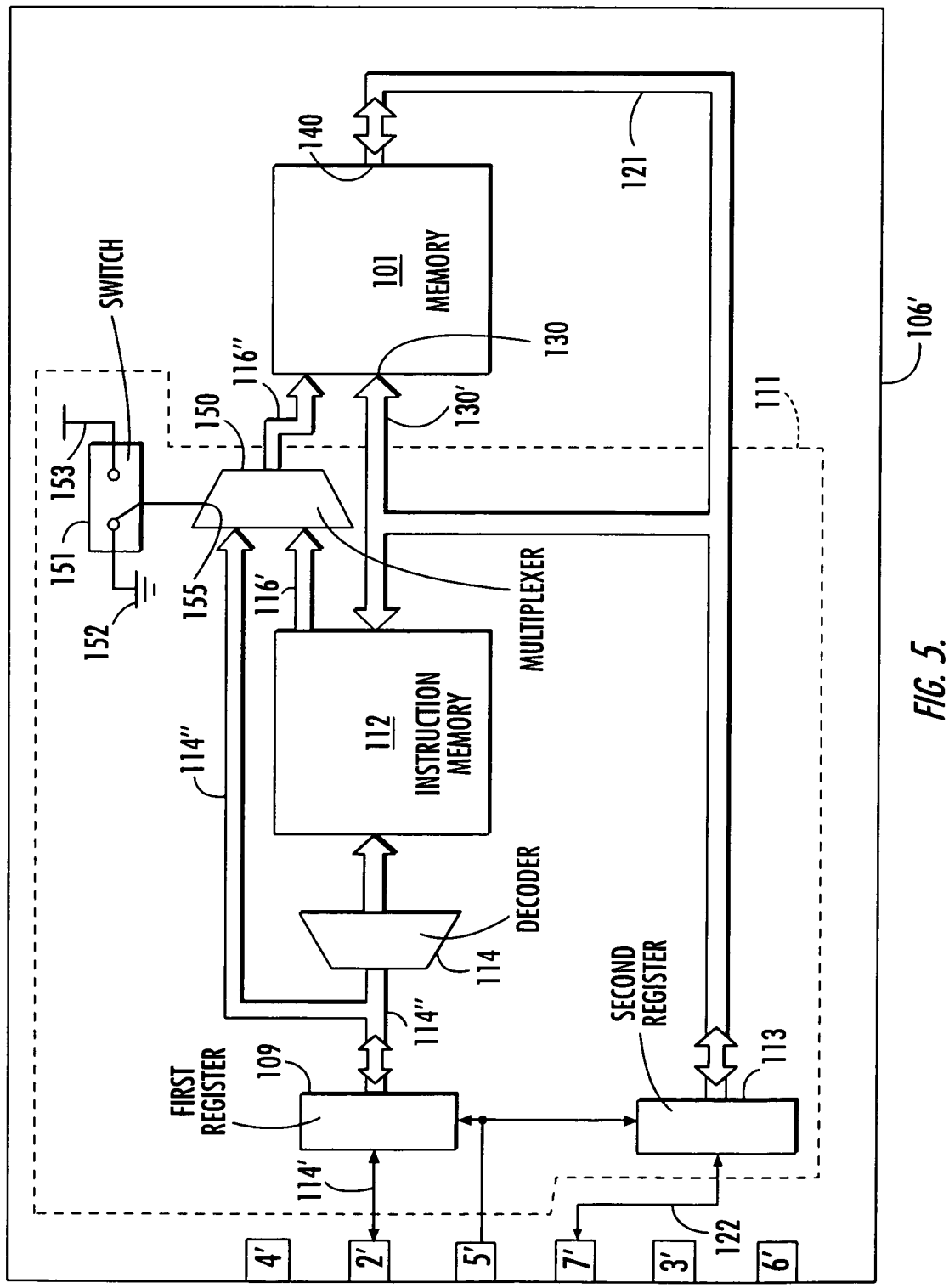
FIG. 5 is a block diagram of a variation of the integrated circuit incorporated in the memory card illustrated in FIG. 4.

FIG. 5 shows a semiconductor integrated-circuit chip 106' forming an alternative variation of the chip 106. The components identical to those of FIG. 4 are indicated in FIG. 5 by the same numeric references and will not be described further.

The bus 114" running from the first register 109 not only supplies the decoder 114, but also supplies an addressable multiplexer 150 via a bus 154. The multiplexer 150 is capable of switching between two different operating states, corresponding to the connection of an output bus 116" of the multiplexer 150 to the bus 114" or to a bus 116'. The bus 116' comprises the lines 117, 118, 119 running from the instruction memory 112, which carry signals for controlling the memory 101, for example the signals OE, PGM and CE.

The multiplexer 150 can be switched between the two operating states according to an enabling signal supplied to an input 155 of the multiplexer. This input 155 of the multiplexer 150 is connected to a switch 151 which can be connected selectively to a ground terminal 152 and to a terminal 153 which can receive a signal which can command it to switch.

The multiplexer 150 is integrated in the chip 106', as is the switch 151, which comprises, for example, registers permanently programmable at the place of manufacture, for selecting the operating mode. These registers can easily be implemented as UPROM cells, in other words EPROM cells suitably protected by a layer of metallization to prevent their exposure to ultraviolet radiation.

When the switch 151 is in a state such that the input 155 of the multiplexer 150 is connected to the ground terminal 152, the memory 101 is connected, via the bus 116", to the bus 116' and therefore to the instruction memory 112. In this case, the integrated chip 106' has the same functionality as the chip 106.

When the switch 151 is in a state such that the input 155 of the multiplexer 150 is connected to the terminal 153, an enabling signal supplied to the terminal 153, and therefore to the terminal 155, causes the multiplexer 150 to connect the output bus to the bus 114" running from the register 109. In this case the memory 101 is not connected to the instruction memory 112, and can receive the signals CE, OE, PGM, and any other signals necessary for controlling its operation, directly from external the chip 106' through the microterminal 2'.

The bus 114" and the multiplexer 150 thus form special bypass means which can be used to bypass the decoder 114 and the instruction memory 112, and therefore the controller 111, by connecting the memory 101 directly to the output of the register 109. In this case, microinstructions, supplied in serial mode to the microterminal 2' and converted from serial to parallel by the register 109, can reach the memory 101.

The possibility, provided by the multiplexer 150, of connecting the EPROM memory 101 to, or disconnecting it from, the instruction memory 112 enables the chip 106' to be used not only within the memory card 100, but also for other applications not requiring the functions provided by the controller 111, or in the present case by the decoder 114 and the instruction memory 112. For example, the integrated circuit of FIG. 4 can be used as a conventional EPROM memory when not within a memory card. This increases the flexibility of the integrated circuit 106', since the manufacturer does not have to provide different production lines for the manufacture of integrated circuits having purely memory functions and integrated circuits for memory cards.

Where the chip 106' is concerned, the choice between using the integrated circuit for a memory card or for another type of application can be made simply by modifying a single photolithographic mask among those provided in the process stream for the manufacture of the integrated circuit, specifically the mask which determines the metallization lines. Alternatively, it is possible to use non-volatile registers comprising UPROM cells, without modifying any photolithographic mask.

The memory card 100 is particularly suitable for applications of the multimedia type. In other words, it can be used for the acquisition of sounds/images in digital format. The memory card 100 can form part of an acquisition and digitization system (hereafter termed acquisition system) for sounds/images, such as a DSC (Digital Still Camera), a video camera with DSC functionality, or an audio recorder for music and speech, and can also be inserted in a personal computer, thus becoming a mass storage medium in exactly the same way as a system disk.

This acquisition system is provided with an appropriate socket having electrical terminals which can come into contact with pins 1-7 of the memory card 100. The acquisition system supplies to pins 1-7 of the memory card 100 the data to be stored, and also the supply voltage Vcc (equal to 5 V, for example) and the ground connections, the command signal CMD, the timing signal CLK, and the signal DAT. The signals required for programming are made available from pins 2-7 of the card 100 to the microterminals 2'-7'. The consequent writing operation takes place according to the procedures described above.

Figure 6:
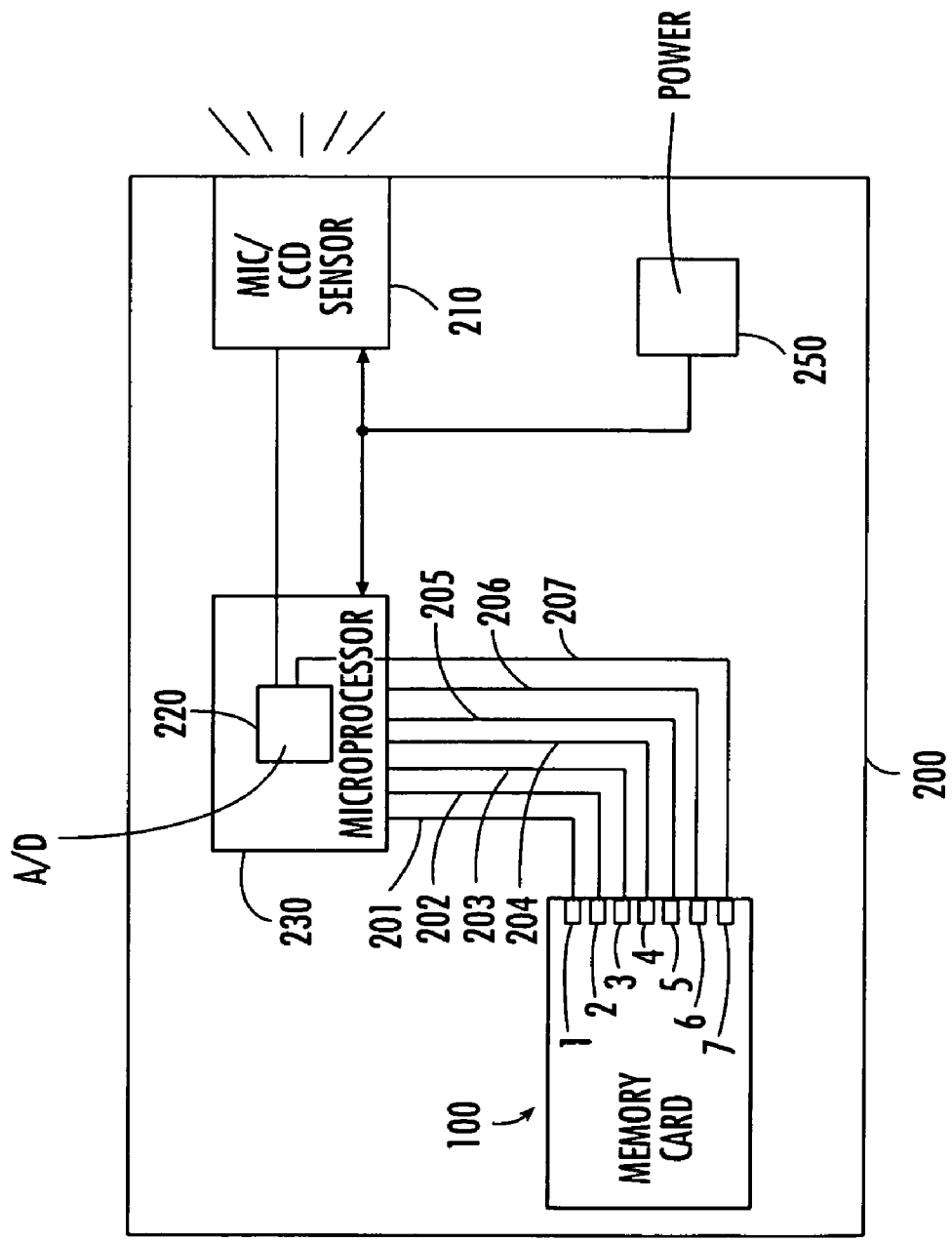
FIG. 6 is a top-level block diagram of a system for acquiring sounds/images in which the memory card according to the present invention can be used.

FIG. 6 shows, in a highly schematic way, an acquisition system 200 housing the memory card 100. This acquisition system 200 comprises conventional transducer means 210, for example a microphone, or a CCD sensor, which enables the sounds/images to be converted into an electrical signal of the analog type.

These transducer means 210 are connected to a microprocessor 230 comprising analog/digital conversion means 220 which enable the analog electrical signal to be converted to a digital signal, in other words into data in digital format. The acquisition means 200 also comprises an electrical power source 250, such as a battery capable of supplying the microprocessor 230 and the transducer means 210, among other elements.

The data in digital format, the addresses of the memory locations, and the command, timing, supply and ground signals are sent by the microprocessor 230 to the memory card 100 via lines 201-207 connected mechanically and electrically to pins 1-7 of the memory card. It should be noted that, in the write phase, the aperture 103 of the memory 101 is protected by the above mentioned adhesive element which is opaque to ultraviolet radiation.

As is known, suitable adapters conforming to various standards are provided for the use of memory cards in host processing systems, such as personal computers. For example, adapters conforming to the PCMCIA standard, particularly for use with portable personal computers, are known, as are adapters for connection to serial or parallel or USB (Universal Serial Bus) ports of non-portable personal computers.

FIG. 7 shows in a highly schematic way a first type of adapter 300, which can act as an interface between the memory card 100 and a processing apparatus, particularly a portable personal computer. In particular, the adapter 300 is made in accordance with the PCMCIA standard, preferably JEIDA. This adapter 300 comprises a lower casing 302, an upper casing 303 and an aperture 301 through which the memory card 100 can be inserted/extracted. At the rear, the adapter 300 is provided with a connector 300', typically a sixty-eight pin connector, for interfacing with a suitable personal computer card.

FIGS. 8a and 8b show in a schematic way, respectively, the lower casing 302, housing the memory card 100, and the upper casing 303. The upper casing 303 comprises a lamp 304 which can generate the electromagnetic radiation having a wavelength suitable for the erasure of the memory 101. In particular, this lamp 304 is capable of generating an ultraviolet radiation having an intensity such that it can erase a memory of the EPROM type.

To increase the intensity of the radiation striking the memory 101, reflective means 306 and 306', such as aluminium plates, are arranged inside the adapter 300. A lamp suitable for use in the adapter 300 is a miniature bulb of suitable power, e.g., a few tens of mW.

The lamp 304 is connected to a step-up transformer 305 supplied, for example, with a voltage of 12 V, which is one of the signals provided for by the standard PCMCIA, through an electrical terminal 309 of the adapter 300—one of the sixty-eight pins of the connector 300'. The step-up transformer 305 raises the voltage, of 12 V for example, to a value sufficient to generate an illumination discharge for the lamp 304.

The illumination of the lamp 304 and the interface with the PCMCIA protocol are also controlled by logic circuits 307, of the integrated type, connected to the connector 300' and to the terminals 1-7 of the memory card via corresponding electrical terminals arranged in such a way that they come into electrical and mechanical contact with pins 1-7 of the memory card when inserted into the adapter.

The adapter 300 can be inserted into an appropriate socket of a processing apparatus. The term processing apparatus denotes a system provided with a memory capable of storing the data from the memory card 100 and provided with a suitable program which enables this type of memory card to be controlled. Additionally, this processing apparatus can be provided with programs which enable the stored audio/video data to be processed, for example by manipulation.

When this adapter is inserted into the processing apparatus, its sixty-eight terminals can be connected to corresponding terminals of the apparatus. Thus the memory card 100 is seen by the processing apparatus as a conventional peripheral unit of the memory-medium type from which it is possible to retrieve the data stored in it. This transfer is carried out by an operation of reading from the memory 101, similar to that described previously.

The adapter 300 forms a special device for interfacing between the memory card and the processing apparatus. The adapter 300 can be used to erase the memory 100 by the generation of electromagnetic radiation by the lamp 304. The lamp 304 can be illuminated by energy supplied by the processor and can be controlled by the latter by the logic circuits 307. After the erasure, the memory card 100 can be re-used for storing new data acquired by the system 200.

Figure 9A:
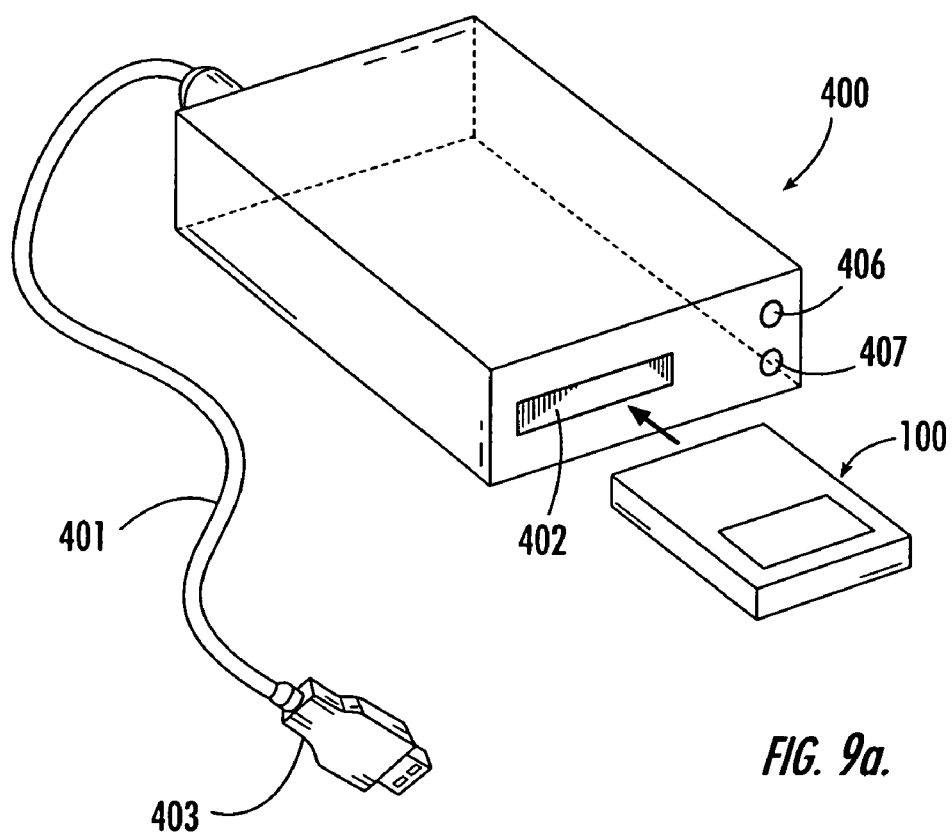
FIGS. 9a and 9b schematically show a second type of adapter for interfacing the memory card according to the present invention with a host processing system.
Figure 9B:
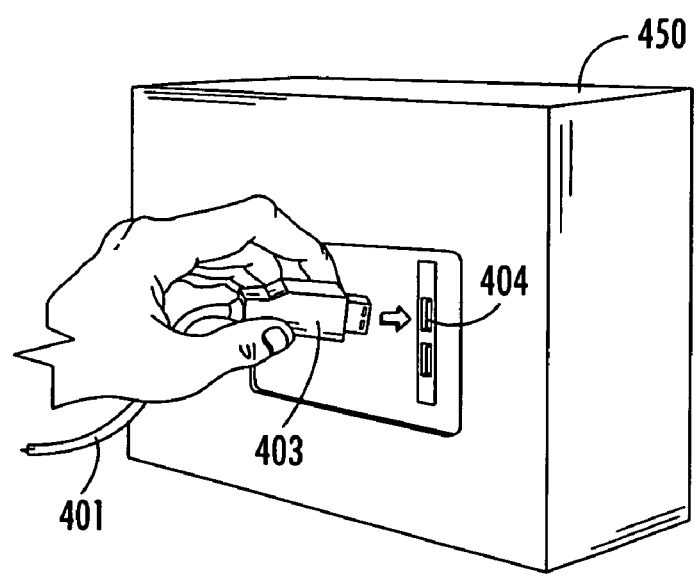
Figure 10:
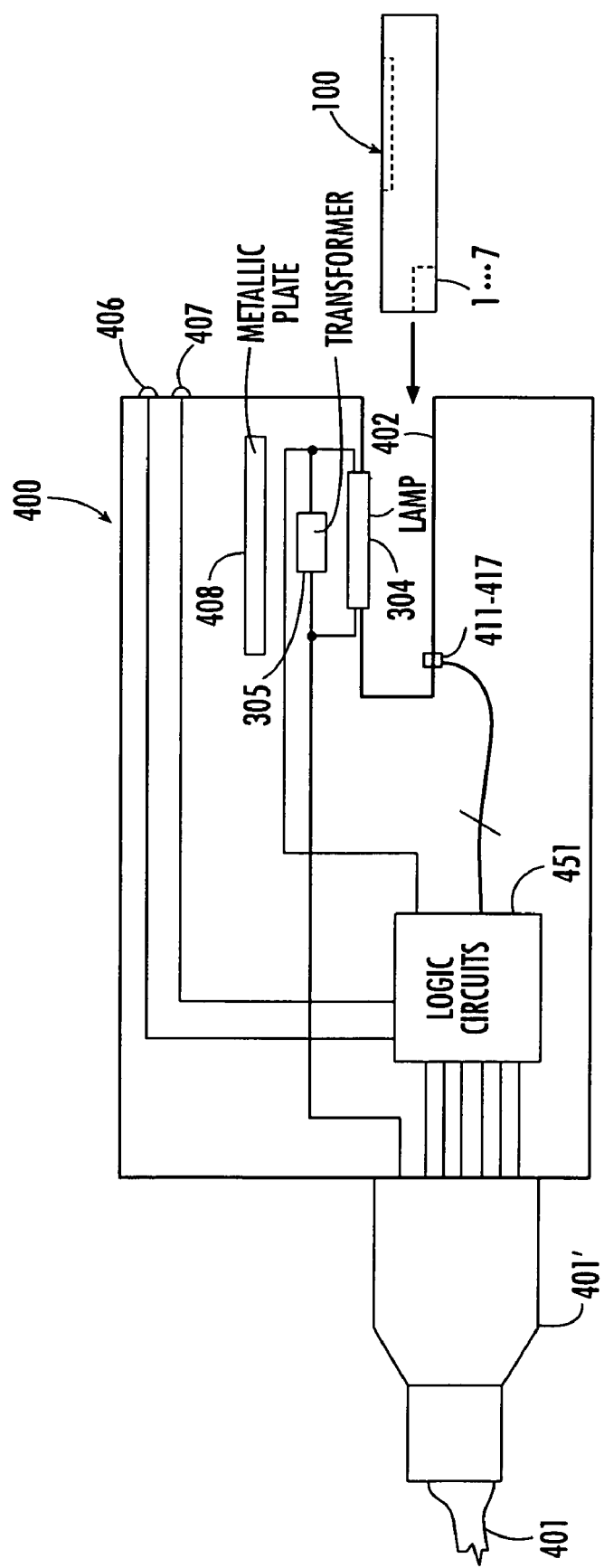
FIG. 10 schematically shows the internal structure of the adapter of FIGS. 9a and 9b.

FIGS. 9a, 9b and FIG. 10 in combination show a further device 400 for interfacing between the memory card 100 and a host processor 450. The interfacing device 400 is external to the processor 450, particularly a non-portable personal computer, in a desktop or tower configuration, and is connected to it by a suitable connecting means 401. This connecting means can be, for example, a serial or parallel bus provided with a suitable plug 403, for example an adapter for connection to a serial port 404 of the personal computer. This serial port 404 is, for example, a USB (Universal Serial Bus) port of the processing apparatus 450.

This interfacing device 400 comprises a socket 402 which houses the memory card 100 and is provided with electrical terminals 411-417 capable of electrically and mechanically contacting pins 1-7 of the memory card 100 when this is housed in the socket 402. These electrical terminals 411-417 are connected to logic circuits 451 which are, in turn, connected by a plug 401' to the connecting means 401.

Additionally, the device 400 comprises a lamp 304, similar to the lamp used in the adapter 300, provided with the step-up transformer 305. The supply voltage for the lamp is supplied through the USB bus of the personal computer. The logic circuits 451, on the other hand, control the illumination of the lamp. The logic circuits 451 also enable the memory card to be interfaced with the USB protocol. Advantageously, the lamp 304 can be associated with reflective means, for example a metallic plate 408, to reflect the radiation emitted from the lamp 304 towards the socket 402 housing the memory card 100.

Preferably, the device 400 is provided with two indicator lamps 406 and 407, of different colors for example, which can signal, respectively, that the data are being transferred from the memory card 100 to the memory of the processing apparatus, and that the data are being erased.

That which is claimed is:

1. A memory card for storing data, and for operating in cooperation with at least one of an external acquisition system and an external processing system, the memory card comprising:
  a casing; and
  an integrated circuit encapsulated within said casing for storing the data, said integrated circuit comprising a non-volatile electrically programmable memory that is erasable by exposure to electromagnetic radiation for permitting a non-electrical erasure of the stored data;
  said casing having an aperture aligned with said non-volatile electrically programmable memory for permitting selective exposure to the electromagnetic radiation to thereby erase the stored data;
  said integrated circuit further comprising
    input/output terminals for receiving and sending the data,
    an additional memory for storing a plurality of microinstructions for controlling said electrically programmable non-volatile memory,
    a decoder connected to said additional memory for converting a command signal to a selection signal for selecting at least one of the plurality of microinstructions, and
    a multiplexer selectively connecting said input/output terminals to said additional memory and to said non-volatile electrically programmable memory.

2. A memory card according to claim 1, wherein the electromagnetic radiation comprises ultraviolet radiation.

3. A memory card according to claim 1, further comprising a polyaniline layer associated with the aperture for protecting said non-volatile electrically programmable memory.

4. A memory card according to claim 1, wherein said casing further comprises reversible closing device for closing the aperture for protecting said non-volatile electrically programmable memory from undesired electromagnetic radiation.

5. A memory card according to claim 4, wherein said reversible closing device comprises an adhesive element that is removable with respect to the aperture.

6. A memory card according to claim 1, wherein said electrically programmable non-volatile memory comprises a first terminal for receiving a programming signal for enabling storage of the data, and a second terminal for receiving a reading signal for enabling output of the stored data; and wherein said input/output terminals are for receiving the data to be stored from at least one of the external acquisition system and the external processing system, for sending the stored data to the external processing system, and for receiving the command signal from at least one of the external acquisition system and the external processing system.

7. A memory card according to claim 6, wherein said integrated circuit comprises a first path connected to said input/output terminals for serially transferring the command signal, and a second path connected to said input/output terminals for serially transferring data and address signals.

8. A memory card according to claim 7, wherein said integrated circuit comprises a first serial/parallel conversion circuit connected to the first path and to said decoder for a serial/parallel conversion of the command signal.

9. A memory card according to claim 7, wherein said integrated circuit comprises a second serial/parallel conversion circuit connected to the second path and to said electrically programmable non-volatile memory for a serial/parallel conversion of the data and address signals.

10. A memory card according to claim 8, wherein said multiplexer is selectively activated and is connected to said first serial/parallel conversion circuit and to said additional memory for bypassing said decoder so that the plurality of microinstructions being supplied to the first path and leaving said first serial/parallel conversion circuit is supplied directly to said electrically programmable non-volatile memory.

11. A memory card according to claim 10, wherein said multiplexer includes an output connected to said electrically programmable non-volatile memory; and wherein said multiplexer has a first operating state corresponding to connection of the output to said additional memory, and has a second operating state corresponding to connection of the output to said first serial/parallel conversion circuit.

12. A memory card for storing data, and for operating in cooperation with at least one of an external acquisition system and an external processing system, the memory card comprising:
  a casing; and
  an integrated circuit carried by said casing for storing the data, said integrated circuit comprising
    a non-volatile electrically programmable memory that is erasable by exposure to electromagnetic radiation for permitting a non-electrical erasure of the stored data and comprising a first terminal for receiving a programming signal for enabling storage of the data, and a second terminal for receiving a reading signal for enabling output of the stored data,
    input/output terminals for receiving the data to be stored from at least one of the external acquisition system and the external processing system, for sending the stored data to the external processing system, and for receiving a command signal from at least one of the external acquisition system and the external processing system,
    a memory control circuit connected to the first and second terminals of said electrically programmable non-volatile memory, and to said input/output terminals for generating the programming and reading signals based upon the command signal, and
    a first path connected to said input/output terminals for serially transferring the command signal, and a second path connected to said input/output terminals for serially transferring data and address signals;
  said casing comprising an aperture adjacent said non-volatile electrically programmable memory that is transparent to the electromagnetic radiation;
  said memory control circuit comprising
    an additional memory for storing a plurality of microinstructions for controlling said electrically programmable non-volatile memory,
    a decoder connected to said additional memory for converting the command signal to a selection signal for selecting at least one microinstruction,
    a first serial/parallel conversion circuit connected to the first path and to said decoder for a serial/parallel conversion of the command signal, and
    a bypass circuit being selectively activated and being connected to said first serial/parallel conversion circuit and to said additional memory for bypassing said decoder so that the plurality of microinstructions being supplied to the first path and leaving said first serial/parallel conversion circuit is supplied directly to said electrically programmable non-volatile memory.

13. A memory card according to claim 12, wherein said bypass circuit comprises a multiplexer including an output connected to said electrically programmable non-volatile memory, and said multiplexer includes a first operating state corresponding to connection of the output to said additional memory, and includes a second operating state corresponding to connection of the output to said first serial/parallel conversion circuit.

14. A memory card according to claim 12, wherein the electromagnetic radiation comprises ultraviolet radiation.

15. A memory card according to claim 12, wherein said aperture exposes a portion of said non-volatile electrically programmable memory to the electromagnetic radiation.

16. A memory card according to claim 15, further comprising polyaniline associated with the aperture for protecting said non-volatile electrically programmable memory.

17. A memory card according to claim 12, wherein said casing further comprises reversible closing device for closing the aperture for protecting said non-volatile electrically programmable memory from undesired electromagnetic radiation.

18. A memory card according to claim 17, wherein said reversible closing device comprises an adhesive element that is removable with respect to the aperture.

* * * * *